(12) United States Patent
Park et al.

(10) Patent No.: US 9,012,943 B2
(45) Date of Patent: Apr. 21, 2015

(54) LIGHT EMITTING DEVICE PACKAGE

(71) Applicant: LG Electronics Inc., Seoul (KR)

(72) Inventors: Daehyun Park, Seoul (KR); Gunyoung Hong, Seoul (KR); Younggil Yoo, Seoul (KR); Dongwon Kang, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 13/951,247

(22) Filed: Jul. 25, 2013

(65) Prior Publication Data

US 2014/0145229 A1  May 29, 2014

(30) Foreign Application Priority Data

Nov. 26, 2012 (KR) .................. 10-2012-0134322

(51) Int. Cl.
*H01L 33/50* (2010.01)

(52) U.S. Cl.
CPC ............ *H01L 33/504* (2013.01); *H01L 33/507* (2013.01); *H01L 33/508* (2013.01)

(58) Field of Classification Search
CPC .................................................... H01L 33/504
USPC ............................................... 257/98; 438/27
See application file for complete search history.

(56) References Cited

U.S. PATENT DOCUMENTS

| 6,531,334 | B2 * | 3/2003 | Sasano ........................... 438/64 |
| 2009/0039375 | A1 * | 2/2009 | LeToquin et al. ............... 257/98 |
| 2009/0045422 | A1 * | 2/2009 | Kato et al. ....................... 257/98 |
| 2010/0127289 | A1 * | 5/2010 | Helbing et al. ................. 257/98 |

* cited by examiner

*Primary Examiner* — Daniel Shook
(74) *Attorney, Agent, or Firm* — KED & Associates LLP

(57) ABSTRACT

A semiconductor device, and more particularly a light emitting device package usable with a lighting apparatus is disclosed. The light emitting device package comprises a package body, a light emitting device located on the package body, the light emitting device emitting light having a first wavelength band, a transparent substrate located over the light emitting device with a distance therebetween, a wavelength conversion layer located on the transparent substrate, wherein the wavelength conversion layer absorbs and converts at least a part of the light having the first wavelength band into light having a second wavelength band, and a color calibration layer located on the wavelength conversion layer, the color calibration layer calibrating color of the wavelength conversion layer.

15 Claims, 4 Drawing Sheets

LIGHT EMITTING DEVICE PACKAGE

Pursuant to 35 U.S.C. §119(a), this application claims the benefit of Korean Patent Application No. 10-2012-0134322, filed on Nov. 26, 2012, which is hereby incorporated by reference as if fully set forth herein.

BACKGROUND OF THE DISCLOSURE

1. Field of the Disclosure

The present invention relates to a semiconductor device, and more particularly to a light emitting device package usable with a lighting apparatus.

2. Discussion of the Related Art

A light Emitting Diode (LED) is a sort of a light emitting device that is fabricated using semiconductor manufacturing processes and entered into practical use in the late 1960s after light emission from a semiconductor device upon voltage application was observed.

Research and development to improve LED efficiency have continued. In particular, interest in LEDs having optical properties sufficient for replacement of conventional light sources is increasing. In addition to increased research into LEDs, research into LED packages and lighting apparatuses using the same are actively underway.

In addition, point light sources and small optical devices have been extensively used in various industrial fields including indication, signaling, display, lighting, biochip, communication, cellular phones, Liquid Crystal Display (LCD), automobile fields, and the like, and continuous growth thereof is expected.

SUMMARY OF THE DISCLOSURE

Accordingly, the present invention is directed to a light emitting device package that substantially obviates one or more problems due to limitations and disadvantages of the related art.

One object of the present invention is to provide a light emitting device package including a wavelength conversion layer, which may achieve enhanced light quality and colorful appearance when used in a lighting apparatus.

To achieve these objects and other advantages and in accordance with the purpose of the invention, as embodied and broadly described herein, a light emitting device package comprises a package body, a light emitting device located on the package body, the light emitting device emitting light having a first wavelength band, a transparent substrate located over the light emitting device with a distance therebetween, a wavelength conversion layer located on the transparent substrate, wherein the wavelength conversion layer absorbs and converts at least a part of the light having the first wavelength band into light having a second wavelength band, and a color calibration layer located on the wavelength conversion layer, the color calibration layer calibrating color of the wavelength conversion layer.

In accordance with another aspect of the present invention, a light emitting device package comprises a package body having a mounting portion, a light emitting device mounted in the mounting portion, the light emitting device emitting light having a first wavelength band, a transparent substrate located over the light emitting device, a wavelength conversion layer located on the transparent substrate, wherein the wavelength conversion layer absorbs and converts at least a part of the light having the first wavelength band into light having a second wavelength band, and a color calibration layer located on the wavelength conversion layer, the color calibration layer calibrating color of the wavelength conversion layer.

In accordance with a further aspect of the present invention, a light emitting device package comprises a package body having a mounting portion, a light emitting device mounted in the mounting portion, the light emitting device emitting light having a first wavelength band, a transparent substrate located over the light emitting device, a wavelength conversion layer located on the transparent substrate, wherein the wavelength conversion layer absorbs and converts at least a part of the light having the first wavelength band into light having a second wavelength band, and a color calibration layer located on the wavelength conversion layer, the color calibration layer reduces saturation of color corresponding to the light having the second wavelength band.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF SPECIFIC EMBODIMENTS

Hereinafter, the embodiments of the present invention will be described in detail with reference to the accompanying drawings.

Specific embodiments of the present invention will be described below in detail with reference to the annexed drawings and various modifications and alterations thereof are possible. However, the present invention should not be limited to the disclosed specific embodiments, and various modifications, additions, and substitutions to the specific elements are possible, without departing from the scope and spirit of the invention as disclosed in the accompanying claims.

It will be understood that, when an element such as a layer, region or substrate is referred to as being "on" another element, it can be directly on the other element or intervening elements may also be present.

In addition, it will be understood that, although the terms first, second, etc. may be used herein to describe various elements, components, regions, layers and/or sections, these elements, components, regions, layers and/or sections should not be limited by these terms.

Figure 1:
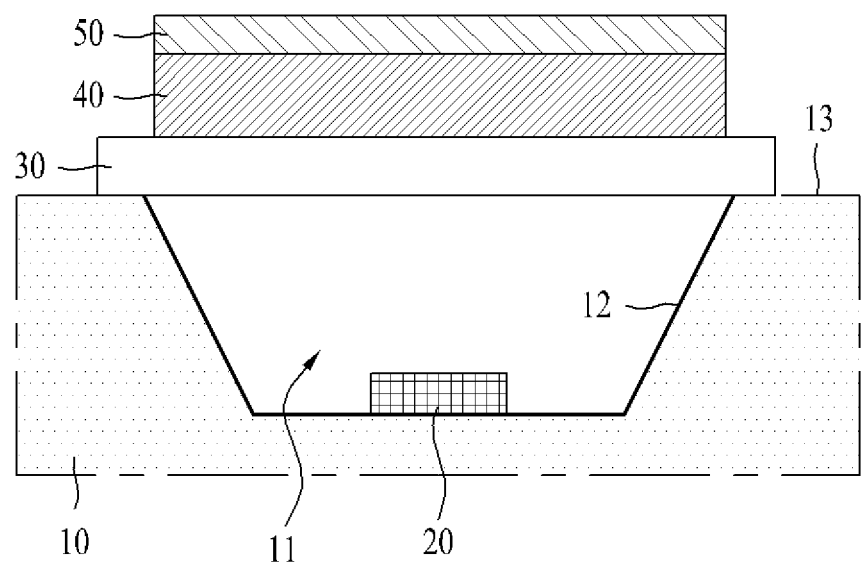
FIG. 1 is a schematic sectional view showing one example of a light emitting device package.

FIG. 1 is a schematic sectional view showing one example of a light emitting device package. As shown, the light emitting device package includes a package body 10 having a mounting portion 11, and a light emitting device 20 is mounted in the mounting portion 11.

Although a variety of light emitting devices may be used as the light emitting device 20, in one example, the light emitting device 20 may be a Light Emitting Diode (LED).

The package body 10 may be provided with a lead (not shown) electrically connected to the light emitting device 20 mounted in the mounting portion 11 and a heat sink (not shown), but a description thereof will be omitted hereinafter.

As shown, the mounting portion 11 may take the form of a recess indented from an upper surface 13 of the package body 10. As such, a slope 12 may be defined around a surface on which the light emitting device 20 is disposed. The slope 12 may serve as a reflective surface.

In addition, the mounting portion 11 may be filled with an encapsulation (not shown). The encapsulation may include silicon gel or epoxy resin.

A wavelength conversion layer 40 may be located over the mounting portion 11 in which the light emitting device 20 is mounted. The wavelength conversion layer 40 may convert at least a part of light having a first wavelength band emitted from the light emitting device 20 into light having a second wavelength band.

The wavelength conversion layer 40 absorbs light having a first wavelength band emitted from the light emitting device 20 and emits converted light having a second wavelength band. As such, the light emitting device package may emit mixed light of the light having the first wavelength band emitted from the light emitting device 20 and the light having the second wavelength band having passed through the wavelength conversion layer 40.

For example, the light emitting device 20 may emit blue light and the wavelength conversion layer 40 may include a yellow phosphor (or fluorescent material). That is, the light having the first wavelength band may be blue light and the light having the second wavelength band may be yellow light.

In this case, as a part of blue light emitted from the light emitting device 20 is absorbed by the wavelength conversion layer 40, yellow light is emitted. As such, white light in which blue light and yellow light are mixed may be emitted.

The wavelength conversion layer 40 may be disposed on a transparent substrate 30 that is located over the mounting portion 11. The transparent substrate 30 may serve as a base for formation of the wavelength conversion layer 40 and a color calibration layer 50. The transparent substrate 30 may include glass, but is not limited thereto.

The color calibration layer 50 may be disposed on the wavelength conversion layer 40 to calibrate color of the wavelength conversion layer 40.

The color calibration layer 50 may calibrate the color of the wavelength conversion layer 40 before and after light emission. For example, the color calibration layer 50 may calibrate color of converted light emitted from the wavelength conversion layer 40 as the wavelength conversion layer 40 is excited by light emitted from the light emitting device 20. Additionally, the color calibration layer 50 may calibrate the color of the wavelength conversion layer 40 when the light emitting device 20 does not emit light.

Lighting apparatuses may mainly adopt white light. As described above, in combination with the light emitting device 20 that emits blue light, the wavelength conversion layer 40 may include the yellow phosphor (or fluorescent material).

Hereinafter, the case in which the light emitting device 20 emits blue light and the wavelength conversion layer 40 includes the yellow phosphor will be described by way of example.

In this case, white light is emitted if the light emitting device 20 is driven. On the other hand, if the light emitting device 20 is not driven, the color of the unexcited wavelength conversion layer 40 may be visible.

The color of the wavelength conversion layer 40 including the yellow phosphor is yellow. However, yellow color may be aesthetically or empirically unpleasant to users.

Accordingly, to eliminate inconvenience due to aesthetically or empirically unpleasant color, the color calibration layer 50 may calibrate the color of the wavelength conversion layer 40.

Figure 2:
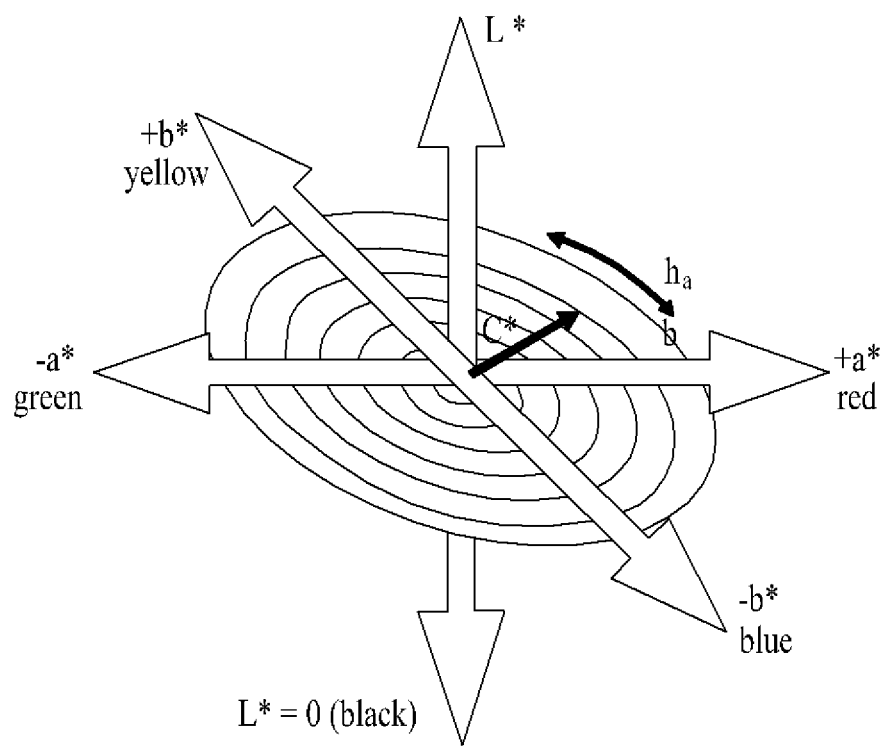
FIG. 2 is a schematic view showing a CIE Lab color space.

FIG. 2 is a schematic view showing a CIE Lab color space. The CIE Lab color space is the result of research to access human sensitivity and is defined by the CIE based on the opponent color theory of yellow-blue and green-red for human color vision.

The CIE color space is the most widely used all over the world to assist easy prediction of the error bound and direction of color upon mixing colors.

Here, L* denotes reflectance (luminance like human visibility) and may be represented by the number in the third decimal. a* denotes a chromaticity diagram, and +a* denotes a red direction and −a* denotes a green direction. In addition, b* denotes a chromaticity diagram, and +b* denotes a yellow direction and −b* denotes a blue direction.

When representing the color of the wavelength conversion layer 40 including the yellow phosphor in the CIE Lab coordinates, the color of the wavelength conversion layer 40 is located in a region in which both values of a* and b* are positive values, which may cause aesthetic repulsion due to a color difference ΔE from white color, both values of a* and b* of which are zero.

The color calibration layer 50 may calibrate the color of the wavelength conversion layer 40. To this end, the color calibration layer 50 may include a phosphor (or fluorescent material) or pigment to calibrate the color of the wavelength conversion layer 40.

More specifically, the color calibration layer 50 may include a blue or green phosphor or pigment. In addition, the color calibration layer 50 may have color complement with the yellow phosphor. That is, the color calibration layer 50 may have a complementary color with the yellow color.

That is, in the Lab coordinate system of FIG. 2, through the use of a material, color of which complements with yellow, at coordinates (a*, b*, 20, 30) where the color calibration layer 50 is not applied, design close to the zero point (0, 0) of the coordinate system may be accomplished.

Figure 3:
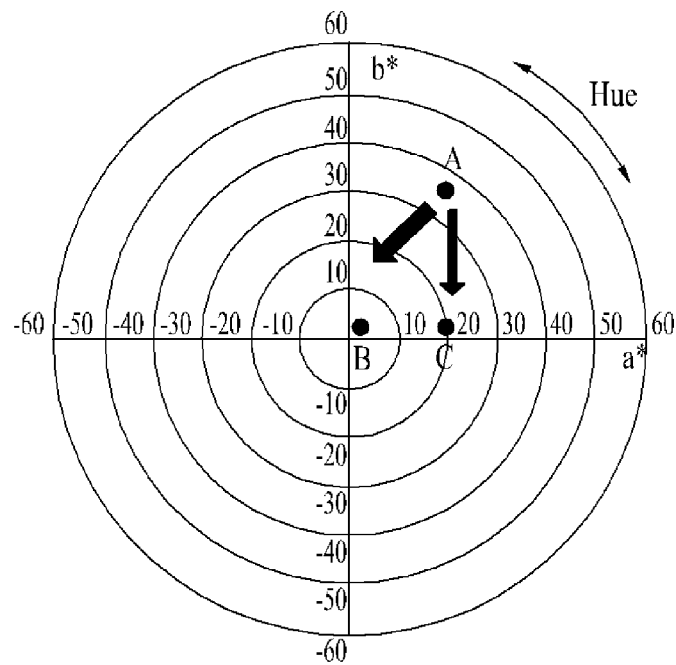
FIG. 3 is a schematic view showing color conversion according to an embodiment.

In the case of Embodiment 1 (C) as shown in Table 1 and FIG. 3, a value of b* may become close to zero by mixing a blue pigment or phosphor with the yellow phosphor in a state A under non-application of the color calibration layer 50.

TABLE 1

|  | Improvement Scheme | a* | b* | ΔE $\sqrt{(0 - a^*)2 + (0 - b^*)2}$ |
|---|---|---|---|---|
| Comparative Example (A) | Non-application of Color Calibration Layer | 20 | 30 | 36 |
| Embodiment 1 (C) | Addition of Blue | 20 | 2 | 20.1 |
| Embodiment 2 (B) | Addition of Green and Blue | 1 | 2 | 2.2 |

Here, a value of a* is 20 and a value of b* is 2. In this case, a color difference ΔE from white is 20.1. This shows that application of the color calibration layer 50 may reduce color difference.

In addition, in the case of Embodiment 2 (B), it will be appreciated that provision of blue and green pigments or phosphors may achieve design close to the zero point of coordinates, achieving minimized color difference.

Here, a value of a* is 1 and a value of b* is 2. In this case, a color difference ΔE from white is 2.2. This shows that application of the color calibration layer 50 may significantly reduce color difference.

As described above, application of the color calibration layer 50 may substantially reduce color saturation of the yellow wavelength conversion layer 40, thereby achieving calibration to color close to gray or white.

In this case, as the blue pigment, a cobalt blue pigment as represented by the chemical formula of $CaCuSi_4O_{10}$, may be utilized. In addition, as the blue phosphor, a material represented by the chemical formula of $(Ca,Sr)_5(PO_4)_3Cl:Eu$ or $(Sr,Ba)_3MgSi_2O_8:Eu$, may be utilized.

In addition, the green pigment may be $Cr_2O_3$ or copper acetoarsenite, and the green phosphor may be a material represented by the chemical forcular of $BaSi_2O_2N_2:Eu$ or $(Ba,Sr)SiO_4:Eu$.

Figure 4:
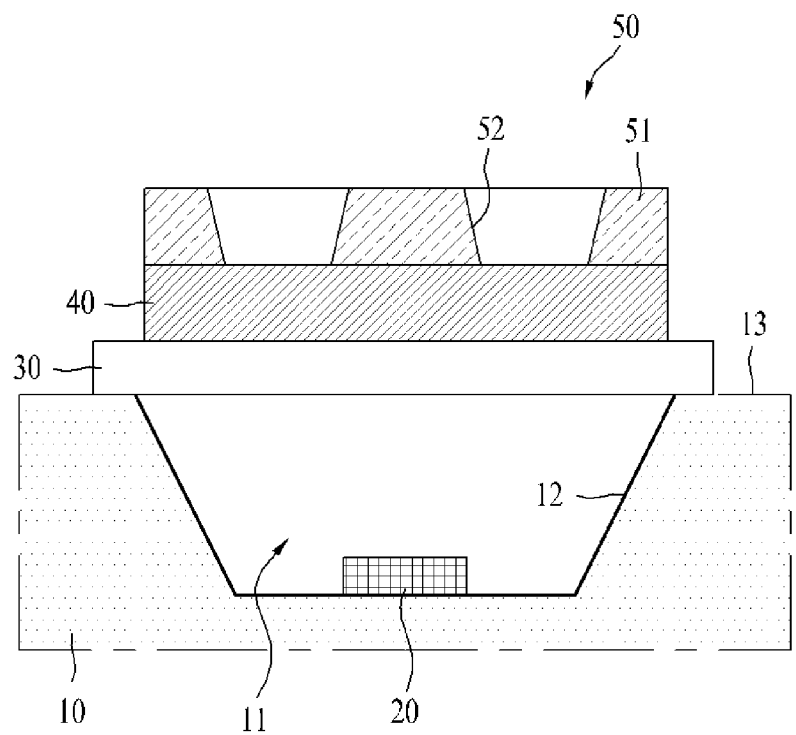
FIG. 4 is a schematic sectional view showing another example of the light emitting device package.

Although the color calibration layer 50 may be a single layer on the wavelength calibration layer 40 as exemplarily shown in FIG. 1, the color calibration layer 50 including a plurality of recesses 52 formed in a matrix 51 may be realized as exemplarily shown in FIG. 4.

Figure 5:
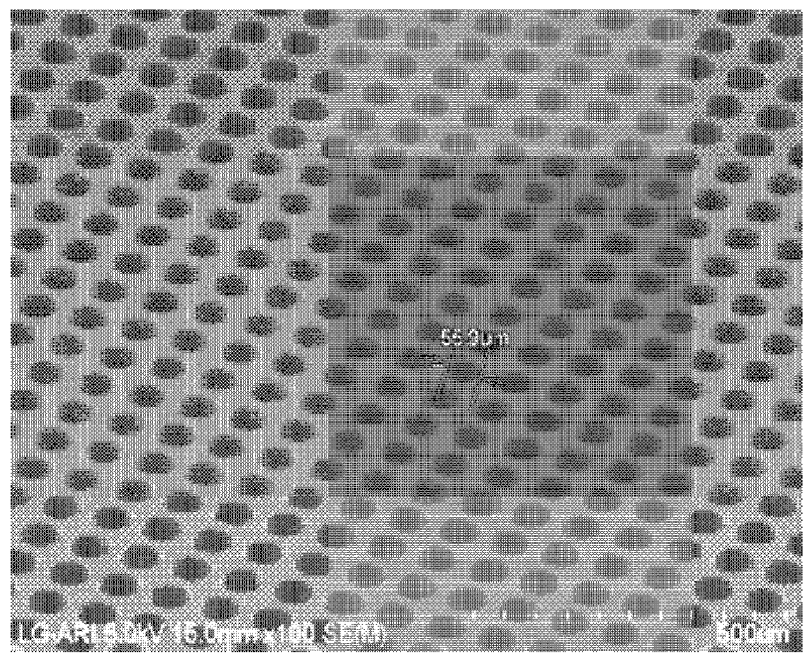
FIG. 5 is a photograph showing one example of a recessed pattern.

Although the size of the plurality of recesses 52 is exaggerated in FIG. 4, the plurality of recesses 52 may have a diameter of dozens of micrometers as exemplarily shown in FIG. 5.

In addition, as exemplarily shown in FIG. 5, the plurality of recesses 52 may be arranged to form a constant distance pattern, and the pattern of the recesses 52 may be a light extraction pattern. That is, the light extraction pattern defined by the plurality of recesses 52 may enhance light extraction efficiency of the light emitting device package.

In this case, the matrix 51 may be formed of a transparent material, such as glass, and the pattern of the recesses 52 may be formed in the matrix 51. Provision of the light extraction pattern may increase light extraction efficiency of the light emitting device package by approximately 6% to 10%.

The matrix 51 provided with the recesses 52 may contain the above described color pigment or phosphor.

Figure 6:
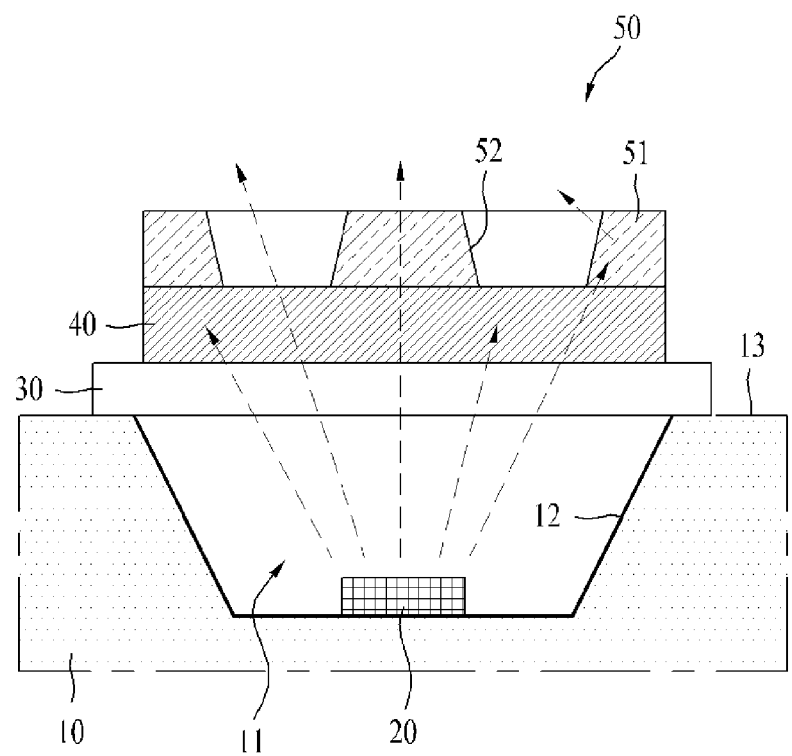
FIG. 6 is a schematic sectional view showing light extraction of a light emitting device package having a recessed pattern.

That is, as exemplarily shown in FIG. 6, as a part of blue light emitted from the light emitting device 20 is absorbed by the wavelength conversion layer 40, the wavelength conversion layer 40 emits yellow light, and the pattern of the recesses 52 formed in the color calibration layer 50 assists efficient outward extraction of the light.

In this case, when the light emitting device 20 is driven, the color calibration layer 50 may act to enhance quality of white light realized by the light emitting device 20 and the wavelength conversion layer 40.

In addition, when the light emitting device 20 is not driven, mainly, the color calibration layer 50 may act to control visible light having passed through the wavelength conversion layer 40, which results in improved colorful and aesthetically pleasing light.

Figure 7:
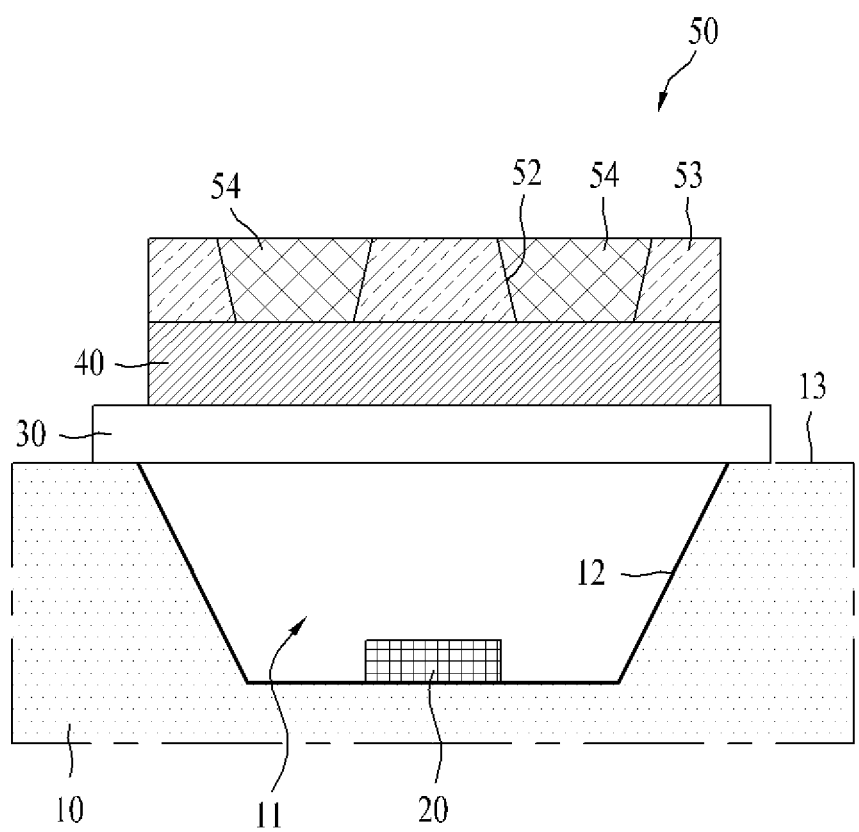
FIG. 7 is a schematic sectional view showing a further example of the light emitting device package.

Alternatively, as exemplarily shown in FIG. 7, the pattern of the recesses 52 may include a pigment or phosphor 54 for color conversion.

That is, a color conversion material may not present in a matrix 53 of the color calibration layer 50, and the pigment or phosphor 54 for color conversion may be located only in the pattern of the recesses 52.

The pigment or phosphor 54 for color conversion, located in the pattern of the recesses 52, is mixed with a color phosphor or pigment of the wavelength conversion layer 40, which may allow light having low difference from white light to be visible from the outside.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A light emitting device package comprising:
a package body;
a light emitting device located on the package body, the light emitting device emitting light having a first wavelength band;
an encapsulation on the light emitting device;
a transparent substrate located on the encapsulation and over the light emitting device with a distance therebetween;
a wavelength conversion layer located on the transparent substrate, wherein the wavelength conversion layer absorbs and converts at least a part of the light having the first wavelength band into light having a second wavelength band, and wherein the second wavelength band corresponds to yellow light; and
a color calibration layer located on the wavelength conversion layer, the color calibration layer calibrating color of the wavelength conversion layer, and wherein the color calibration layer has a color complement with color corresponding to the yellow light.

2. The package according to claim 1, wherein the color calibration layer comprises a blue or green material.

3. The package according to claim 1, wherein the color calibration layer comprises a pigment or phosphor.

4. The package according to claim 1, wherein the color calibration layer comprises a plurality of recesses.

5. The package according to claim 4, wherein the plurality of recesses comprises a pigment or phosphor.

6. The package according to claim 4, wherein the plurality of recesses defines a light extraction pattern.

7. The package according to claim 1, wherein the color calibration layer serves to calibrate color of the wavelength conversion layer before the light emitting device emits light.

8. A light emitting device package comprising:
a package body having a mounting portion, an upper surface and a recess indented from the upper surface;
a light emitting device mounted in the mounting portion, the light emitting device emitting light having a first wavelength band;
a transparent substrate located over the light emitting device, and the transparent substrate is located on the upper surface of the package body;
a wavelength conversion layer located on the transparent substrate, the wavelength conversion layer absorbs and converts at least a part of the light having the first wavelength band into light having a second wavelength band; and
a color calibration layer located on the wavelength conversion layer, the color calibration layer calibrating color of the wavelength conversion layer, wherein the color calibration layer includes a plurality of recesses to form a light extraction pattern.

9. The package according to claim 8, wherein the color calibration layer has color complement with color corresponding to the light having the second wavelength band.

10. The package according to claim 8, wherein color corresponding to the light having the second wavelength band is yellow, and wherein the color calibration layer comprises a blue or green material.

11. The package according to claim 8, wherein the plurality of recesses comprises a pigment or phosphor.

12. A light emitting device package comprising:
a package body having a mounting portion;
a light emitting device mounted in the mounting portion, the light emitting device emitting light having a first wavelength band;
an encapsulation on the light emitting device;
a transparent substrate located on the encapsulation and over the light emitting device with a distance between the transparent substrate and the light emitting device;
a wavelength conversion layer located on the transparent substrate, wherein the wavelength conversion layer absorbs and converts at least a part of the light having the first wavelength band into light having a second wavelength band, and wherein the second wavelength band corresponds to yellow light; and
a color calibration layer located on the wavelength conversion layer, the color calibration layer reduces saturation of color corresponding to the light having the second wavelength band, and wherein the color calibration layer comprises a blue or green pigment.

13. The package according to claim 12, wherein the mounting portion has a recess indented from an upper surface of the package body.

14. The package according to claim 12, wherein the color calibration layer has color complement with color corresponding to the light having the second wavelength band.

15. The package according to claim 12, wherein the color calibration layer comprises a plurality of recesses.

* * * * *